United States Patent
Arai (10) Patent No.: US 8,093,943 B2
(45) Date of Patent: Jan. 10, 2012

(54) PHASE NOISE CORRECTION DEVICE AND ITS METHOD

(75) Inventor: Jungo Arai, Tokyo (JP)

(73) Assignee: NEC Corporation, Tokyo (JP)

( * ) Notice: Subject to any disclaimer, the term of this patent is extended or adjusted under 35 U.S.C. 154(b) by 212 days.

(21) Appl. No.: 12/526,983

(22) PCT Filed: Feb. 6, 2008

(86) PCT No.: PCT/JP2008/051957
§ 371 (c)(1),
(2), (4) Date: Aug. 13, 2009

(87) PCT Pub. No.: WO2008/099735
PCT Pub. Date: Aug. 21, 2008

(65) Prior Publication Data
US 2010/0097151 A1    Apr. 22, 2010

(30) Foreign Application Priority Data
Feb. 14, 2007  (JP) .................................. 2007-033457

(51) Int. Cl.
*H03D 3/22* (2006.01)
*H03D 3/24* (2006.01)
(52) U.S. Cl. ...... 329/319; 329/320; 332/127; 455/114.2
(58) Field of Classification Search .................. 329/319, 329/320; 332/127; 455/114.2
See application file for complete search history.

(56) References Cited

U.S. PATENT DOCUMENTS
2007/0120617 A1* 5/2007 Sato et al. ..................... 332/128
2011/0182389 A1* 7/2011 Breems et al. ................ 375/346

FOREIGN PATENT DOCUMENTS
| JP | 8-023290 A | 1/1996 |
| JP | 8-107315 A | 4/1996 |
| JP | 2000013254 A | 1/2000 |
| JP | 2006108968 A | 4/2006 |
| WO | 2004001989 A | 12/2003 |

OTHER PUBLICATIONS
International Search Report for PCT/JP2008/051957 mailed May 13, 2008.

* cited by examiner

*Primary Examiner* — Robert Pascal
*Assistant Examiner* — James E Goodley (57) ABSTRACT

A phase noise correction device having a function for accurately detecting a phase noise component and capable of reducing a load on a reception device is provided. A phase noise correction device for correcting a phase noise generated in a local oscillator includes: a division section that divides a signal generated in the local oscillator; a reference signal generation section that generates a signal of the same frequency as that of the divided signal; a phase difference detection section that detects a phase difference between the divided signal and the generated reference signal; and a phase noise correction section that gives a phase rotation to a baseband signal in the direction that cancels the phase noise according to the detected phase difference as a phase noise component.

12 Claims, 13 Drawing Sheets

PHASE NOISE CORRECTION DEVICE AND ITS METHOD

This present application is the National Phase of PCT/JP2008/051957, filed Feb. 6, 2008, which is based upon and claims the benefit of priority from Japanese patent application No. 2007-033457, filed on Feb. 14, 2007, the disclosure of which is incorporated herein in its entirety by reference.

TECHNICAL FIELD

The present invention relates to a phase noise correction device that corrects a phase noise generated in a local oscillator and its method and, more particularly, to a phase noise correction device that detects a phase noise component directly from a local signal used for modulation/demodulation or frequency conversion, which is a generation source of the phase noise and its method.

BACKGROUND ART

At present, a phase noise generated in a local oscillator is recognized as a problem that affects quality of high-frequency wireless digital communication.

In particular, since the phase noise greatly affects communication quality which is an essential part of a communication device, various methods for reducing the influence of the phase noise have been studied. For example, Patent Document 1 is known as the method for reducing the influence of the phase noise.

Further, the influence that the phase noise exerts on the communication quality becomes greater along with a higher frequency of recent communication devices.

Further, achievement of both an improvement in performance and reduction in price of a product for reducing the phase noise is required and, in view of this, a method for providing quality equivalent to or better than a currently-used product is required even in the case where a device that is more moderate in price but lower in performance than the currently-used device is used.

Figure 12:
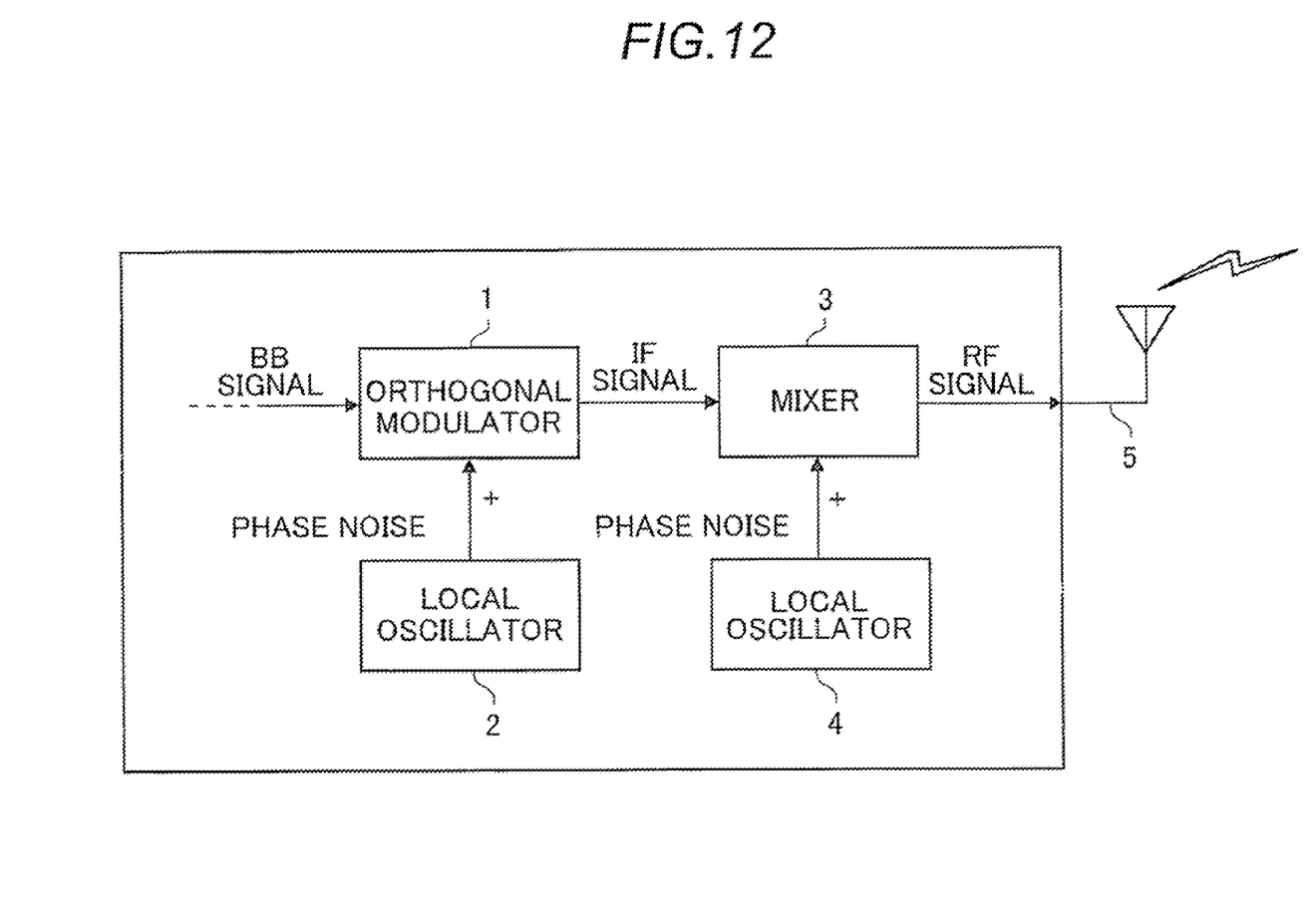
FIG. 12 is a view schematically showing a transmitter used in high-frequency wireless communication.
Figure 13:
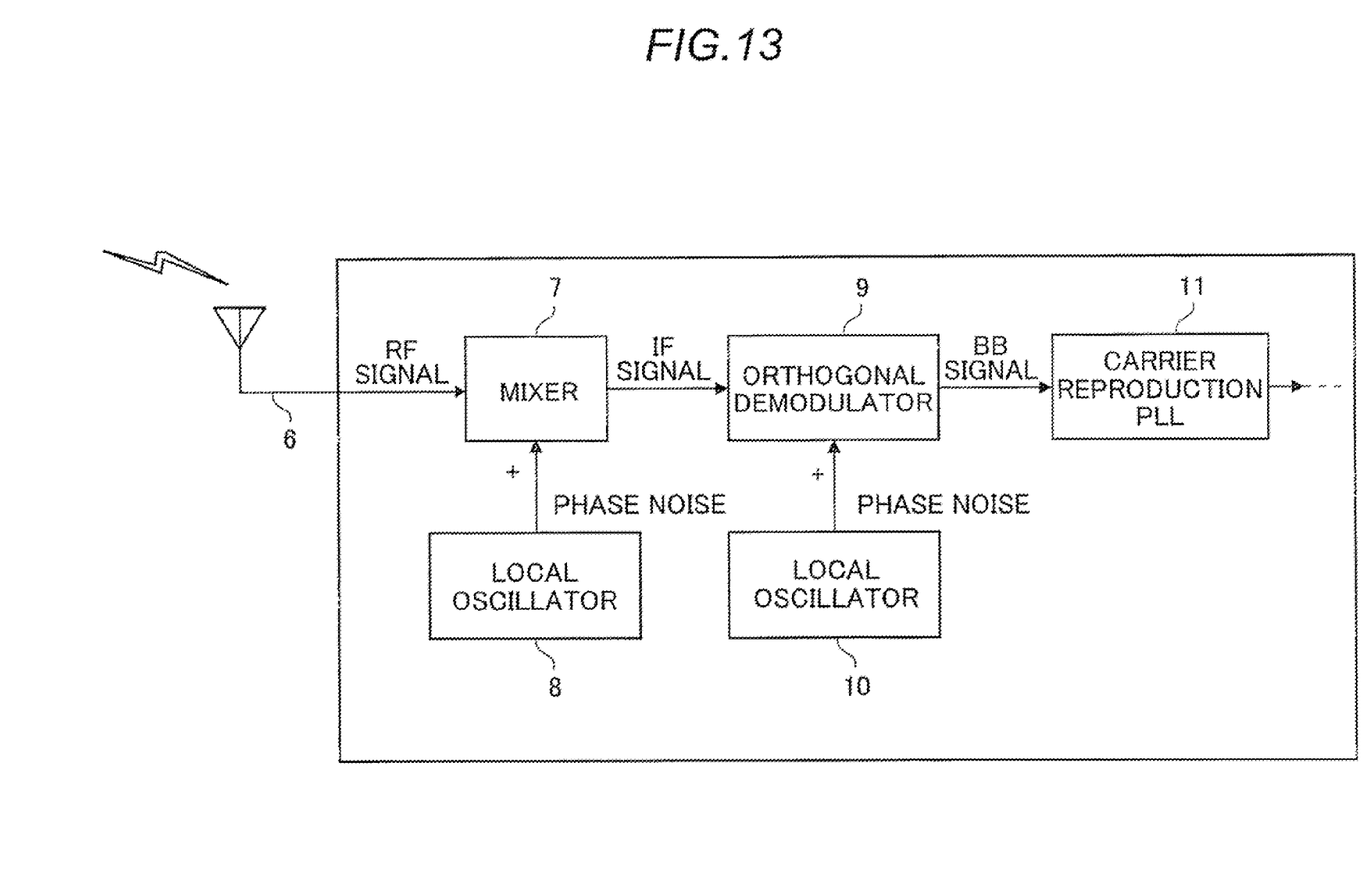
FIG. 13 is a view schematically showing a receiver used in high-frequency wireless communication.

With reference to FIGS. 12 and 13, an outline of a transmitter/receiver used in high-frequency wireless communication will be described. FIG. 12 shows a transmitter part, and FIG. 13 shows a receiver part.

An orthogonal demodulator 9 (see FIG. 13) used for demodulating an RF signal into a baseband signal in this related art has a main function of performing carrier or clock reproduction in a transmission device performing wireless digital communication under the influence of phasing or the like which causes degradation of signals on a transmission path.

FIG. 12 and FIG. 13 show outlines of a transmitter and receiver used in high-frequency wireless digital communication, respectively. In the transmitter, a baseband signal (BB signal) is converted into an IF (Intermediate Frequency) signal by an orthogonal modulator 1 and a local oscillator 2. The baseband signal converted into the IF signal is further converted into RF (Radio Frequency) signal by a mixer 3 and a local oscillator 4. The baseband signal converted into the RF signal is then transmitted from an antenna 5.

The receiver receives the signal transmitted from the transmitter at an antenna 6. The received RF signal is converted into an IF signal by a mixer 7 and a local oscillator 8 and then converted into a baseband signal by an orthogonal demodulator 9 and a local oscillator 10.

In this configuration, a total of four oscillators are used. The phase noises generated from the four local oscillators are uncorrelated with one another.

Patent Document 1: International Publication Pamphlet No. WO 2004/001989

SUMMARY OF THE INVENTION

Technical Problem

In the above related art, correction of the phase noise is performed at the same time when a frequency error between the local oscillators on the transmitter side and receiver side is performed by a carrier reproduction PLL (Phase Locked Loop) 11 after conversion of the reception signal into the baseband signal. However, even with such a method, degradation occurs in carrier reproduction performance when a strong phase noise component is present. That is, it has been difficult for a demodulator using the reproduction PLL (Phase Locked Loop) of the related art to obtain satisfactory characteristics in a state where a degradation component caused due to the phase noise is added.

Further, if the reception data is data transmitted by a multilevel modulation scheme such as 64QAM (Quadrature Amplitude Modulation) or 256QAM, the amplitude or phase of the data differs depending on the signal reception point, so that there is a possibility that accurate phase noise cannot be detected due to the influence of amplifier nonlinear distortion or quantization error.

In addition, the method according to the related art detects the phase noise based on the displacement or the like of the reception point of the modulated/demodulated signal, so that the phase noise detection may be affected by external factors such as phasing or thermal noise.

Further, in the related art, the phase noise correction is not performed on the transmitter side but performed only on the receiver side. As a result, a load only on the receiver side is increased.

An object of the present invention is to provide a phase noise correction device having a function for accurately detecting a phase noise component and capable of reducing a load on a receiver and the method thereof.

Solution to Problem

According to an aspect of the present invention, there is provided a phase noise correction device for correcting a phase noise generated in a local oscillator, including: a division section that divides a signal generated in the local oscillator; a reference signal generation section that generates a signal of the same frequency as that of the divided signal; a phase difference detection section that detects a phase difference between the divided signal and the generated reference signal; and a phase noise correction section that gives a phase rotation to a baseband signal in the direction that cancels the phase noise according to the detected phase difference as a phase noise component.

According to a second aspect of the present invention, there is provided a phase noise correction method for correcting a phase noise generated in a local oscillator, including: a step in which a division section divides a signal generated in the local oscillator; a step in which a reference signal generation section generates a signal of the same frequency as that of the divided signal; a step in which a phase difference detection section detects a phase difference between the divided signal and the generated reference signal; and a step in which a phase noise correction section gives a phase rotation to a baseband signal in the direction that cancels the phase noise according to the detected phase difference as a phase noise component.

ADVANTAGEOUS EFFECTS OF THE INVENTION

In the present invention, a signal generated by a local oscillator is divided, a signal of the same frequency as that of the divided signal is generated, a phase difference between the divided signal and generated signal is detected, and a phase rotation is given to a baseband signal in the direction that cancels the phase noise according to the detected phase difference as a phase noise component. With the above configuration, it is possible to detect the phase noise component more accurately for correction of the phase noise.

EXPLANATION OF REFERENCE

1: Orthogonal modulator
2: Local oscillator
3: Mixer
4: Local oscillator
5: Antenna
6: Antenna
7: Mixer
8: Local oscillator
9: Orthogonal demodulator
10: Local oscillator
11: Carrier reproduction PLL
12: Divider
13: Divider
14: Reference oscillator
15: Phase difference detector
16: Phase difference detector
17: Constant multiplier
18: Constant multiplier
19: Adder
20: Phase noise corrector
21: Divider
22: Divider
23: Reference oscillator
24: Phase difference detector
25: Phase difference detector
26: Constant multiplier
27: Constant multiplier
28: Adder
29: Complex multiplier
30: Carrier phase detector
31: Carrier loop filter
32: Accumulator
33: Adder
34: SIN/COS table
35: Phase shift detector
36: Phase shift detector
37: Phase shift detector
38: Phase shift detector
39: Phase comparator
40: Loop filter
41: Numeric controlled oscillator

DESCRIPTION OF EMBODIMENTS

Configuration of Exemplary Embodiment

A configuration of a transmitter will be described using FIG. 1. In addition, operation of the transmitter will briefly be described.

First, a configuration for detecting a phase noise component generated in a local oscillator 2 will be described.

Since it is difficult for the transmitter to detect the phase noise component directly from a signal generated in a high-frequency local oscillator 2, a divider 12 is used to divide the signal so that the phase thereof can be detected.

The transmitter has a reference oscillator 14 that generates a signal of the same frequency as that of the divided signal in order to detect only the phase noise component included in the divided signal.

Then, the transmitter uses a phase difference detector 15 to detect a phase difference between the divided signal and signal generated by the reference oscillator 14 and outputs the detected phase difference as a phase noise component.

The detected phase noise component has been divided by the divider 12, that is, the phase angle thereof has been multiplied by a division ratio of 1/N.

Thus, the transmitter uses a constant multiplier 17 to multiply the phase angle by N.

Meanwhile, the transmitter also detects a phase noise component generated in a high-frequency local oscillator 4 in the same manner using a divider 13, a phase difference detector 16, and a constant multiplier 18.

Since the reference oscillator 14 is used in common by the phase difference detectors 15 and 16 in the present exemplary embodiment, it is necessary to set the division ratio so that the frequencies of the signals divided by the dividers 12 and 13 become the same.

The signals generated by the local oscillator 2 used for modulating the baseband signal into IF signal and local oscillator 4 used for frequency-converting the IF signal into RF signal include phase noise components uncorrelated with each other.

Then, the transmitter uses an adder 19 to add the phase noise components of the local oscillators 2 and 4 detected by the above processing.

Finally, the transmitter uses a phase noise corrector 20 to give a phase rotation in the direction opposite to the phase noise obtained as a result of the addition by the adder 19 to a baseband signal to thereby correct the phase noise. Note that the phase noise corrector 20 used in the present exemplary embodiment is constituted by a complex multiplier circuit and configured to perform phase correction on a complex plane.

Next, a configuration of a receiver will be described using FIG. 2.

The receiver detects the phase noise component in the same manner as the above transmitter. The point that a phase noise component generated in a high-frequency local oscillator 8 is detected using a divider 22, a phase difference detector 25, and a constant multiplexer 27 and phase noise component generated in a high-frequency local oscillator 10 is detected using a divider 21, a phase difference detector 24, and a constant multiplexer 26 is the same as the configuration of the above transmitter.

As in the case of the above transmitter, a reference oscillator 23 is used in common by the phase difference detectors 24 and 25, so that it is necessary to set the division ratio so that the frequencies of the signals divided by the dividers 21 and 22 become the same.

After that, also in the case of the above transmitter, the receiver uses an adder 28 to add the phase noise components reproduced by the constant multiplexers 26 and 27.

Then, the receiver gives a phase rotation in the direction opposite to the reproduced phase noise as in the case of the above transmitter, but in a different manner.

The transmitter uses the phase noise corrector 20 in order to give the opposite direction rotation, whereas the receiver uses an existing carrier reproduction PLL 11.

Figure 3:
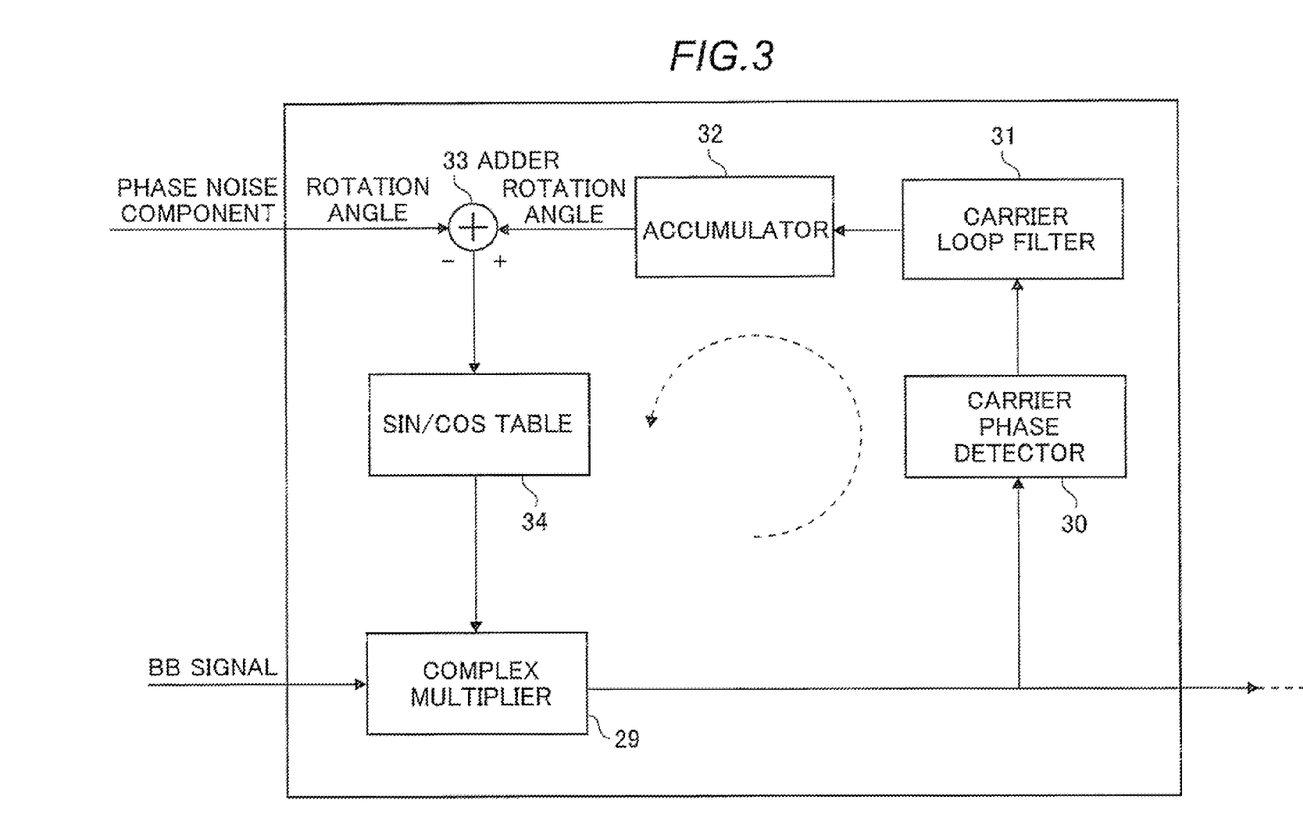
FIG. 3 is a view showing an internal configuration of a carrier reproduction PLL.

Here, an internal configuration of the carrier reproduction PLL 11 is shown in FIG. 3.

The carrier phase of an input baseband signal is corrected by a complex multiplier 29 and is output therefrom. The resultant output signal is input to a carrier phase detector 30 where the phase difference of the signal is detected. Then, a signal whose high-frequency component has been removed by a carrier loop filter 31 is input to an accumulator 32.

The sawtooth wave of a frequency corresponding to the level of the input signal is output from the accumulator 32. This sawtooth wave represents the phase rotation angle in the complex multiplier 29.

The sawtooth wave output from the accumulator 32 selects SIN/COS that gives a phase rotation of the angle output from the accumulator 32 in a SIN/COS table 34 and is then output to the complex multiplier 29.

That is, the accumulator 32 and SIN/COS table 34 constitute an NCO (Numeric Controlled Oscillator).

The above circuit is the configuration of the PLL that performs carrier reproduction.

It can be seen that the output of the accumulator 32 represents the angle of a phase rotation. The phase noise that the receiver has reproduced using the adder 28 shown in FIG. 2 also represents the angle of a phase rotation. Thus, addition of the two information using an adder 33 shown in FIG. 3 enables both carrier reproduction and phase noise correction to be executed by a single complex multiplication process.

The signals generated by the local oscillator 8 used for frequency-converting the RF signal into IF signal and local oscillator 10 used for demodulating the IF signal into baseband signal include phase noise components uncorrelated with each other.

Each of the reference oscillators 14 and 23 for detecting the phase noise of the local oscillator has a sufficiently smaller phase-noise characteristic than that of each of the local oscillators 2, 4, 8, and 10.

(Operation of Exemplary Embodiment)

Operation of the present exemplary embodiment will be described in detail below.

The methods of correcting the phase noises generated in the local oscillators 2, 4, 8, and 10 have a lot in common with one another.

Therefore, the correction operation of the phase noises generated in the local oscillators 2 and 4 provided in the transmitter will be described first, and then the correction operation of the phase noises generated in the local oscillators 2 and 4 provided in the receiver will be described focusing on differences from the operation in the transmitter.

First, operation of the transmitter will be described with reference to FIG. 1 again.

In the present exemplary embodiment, the phase noise generated in the local oscillator 2 used by the orthogonal modulator 1 and phase noise generated in the local oscillator 4 used by the mixer 3 are corrected.

Thus, two dividers 12 and 13 corresponding to both the local oscillators are prepared. In this case, it is necessary for the transmitter to have a configuration in which the phase noise components of both the local oscillators 2 and 4 can be detected with one reference oscillator 14.

In order to achieve this, a previous setting is required so that the output frequencies of the reference oscillator 14 and dividers 12, 13 become the same.

It is difficult to accurately extract the phase noise components generated in the local oscillators 2 and 4 directly from the RF frequency and IF frequency generated by the local oscillators 2 and 4.

Therefore, the transmitter uses the dividers 12 and 13 to frequency-divide the signals generated by the local oscillators 2 and 4 respectively to produce signals of the same frequency as a signal generated by the reference oscillator 14, from which the phase noise components can be extracted.

Then, each of the phase difference detectors 15 and 16 detects a phase difference between the divided signal and signal generated by the reference oscillator 14. With this operation, only the phase noise component is detected.

Here, frequency conversion based on frequency division and frequency conversion based on mixing will be described using the following equations 1, 2, and 3 and FIG. 4.

[Numeral 1]

$$\sin(\omega_1 t) \times \sin(\omega_2 t) = \frac{1}{2}\{-\cos(\omega_1 t + \omega_2 t) + \cos(\omega_1 t - \omega_2 t)\} \quad (1)$$

A relationship between the frequency conversion based on mixing and phase noise is shown by Numeral 1. This equation represents a principle of the mixing, which shows that when a signal having two different frequencies is input, a signal having a sum component ($\omega_1+\omega_2$) of the two frequencies and signal having a difference component ($\omega_1-\omega_2$) between the two frequencies are output.

[Numeral 2]

$$\sin(\omega_1 t + \theta(t)) \times \sin(\omega_2 t) = \qquad (2)$$
$$\frac{1}{2}\{-\cos(\omega_1 t + \theta(t) + \omega_2 t) + \cos(\omega_1 t + \theta(t) - \omega_2 t)\}$$

Numeral 2 shows a propagation state of the phase noise in the case where a phase noise component θ(t) is included only in a signal having a frequency of ω1.

It can be seen from Numeral 2 that the phase noise component θ(t) is directly reflected both in the signal having the sum component and signal having the difference component.

The mixer 3 and mixer 7 that have conventionally been used use the sum component and difference component respectively to perform frequency conversion, so that the phase noise component generated in the local oscillator is propagated to the rear stage without being attenuated.

[Numeral 3]

$$\sin(\omega t + \theta(t)) \times \sin(\omega t) = \frac{1}{2}\{-\cos(2\omega t + \theta(t)) + \cos(\theta(t))\} \qquad (3)$$

Finally, Numeral 3 shows a case where the ω1 and ω2 shown in Numeral 2 have the same frequency.

In this case, each of the phase difference detectors 15, 16, 24, and 25 outputs a signal having a double (2ω) frequency component and a phase noise component having no frequency component. Each of the phase difference detectors 15, 16, 24, and 25 according to the present exemplary embodiment detects only the phase noise component by using the frequency conversion based on the mixing performed in the case where the ω1 and ω2 have the same frequency, which is shown by Numeral 3.

Figure 4:
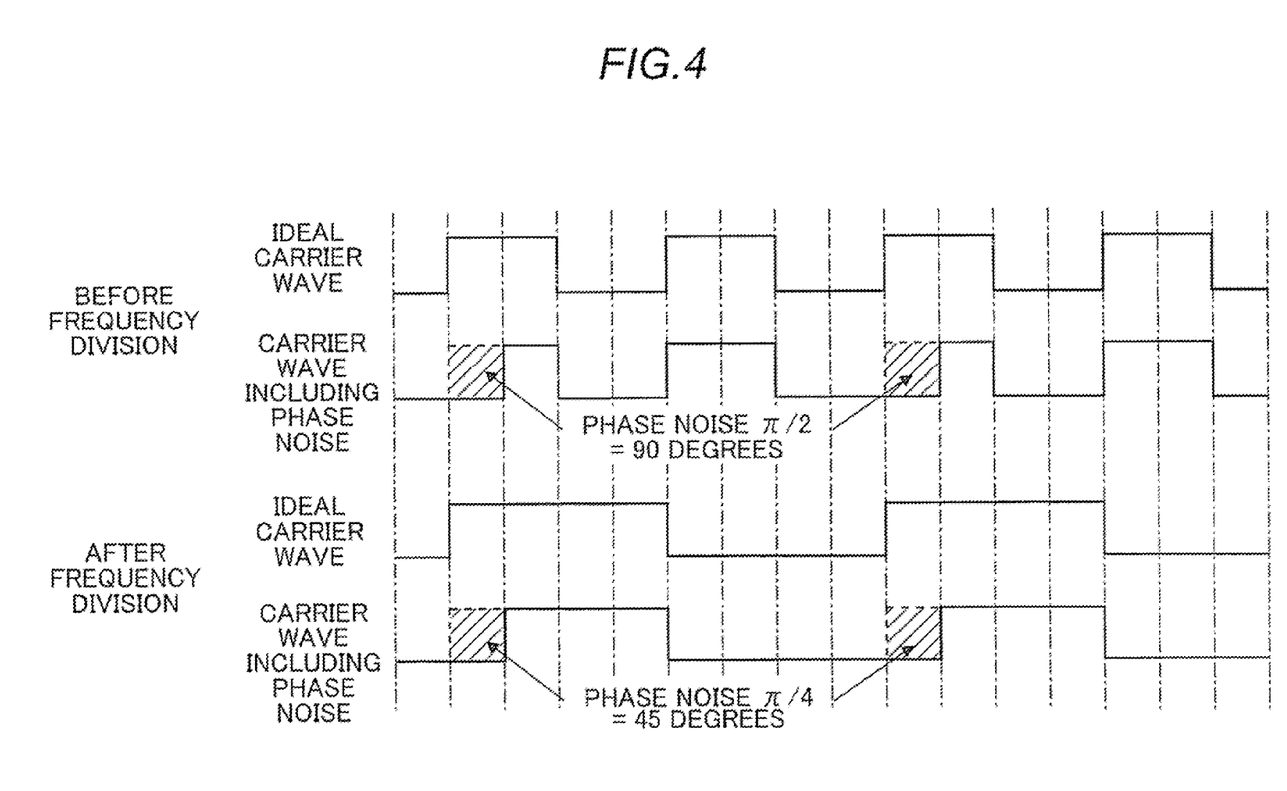
FIG. 4 is a view showing a relationship between frequency conversion based on frequency division and phase information in the case where division ratio is 1/2.

FIG. 4 is a view showing a relationship between frequency conversion based on frequency division and phase noise. How the phase noise after frequency division goes will be described if the phase noise before the frequency division is π/2 in the case where a frequency is reduced to ½ by the frequency division.

If the frequency before the frequency division is set to 1 Hz, a phase noise π/2 corresponds to ¼ seconds. Even when a signal having the 1 Hz frequency is divided by 2, the absolute time (¼ seconds) of the phase noise is not changed.

On the other hand, the frequency after the signal having 1 Hz frequency has been divided by 2 is ½ Hz, that is, the period of the signal is doubled. As a result, the angle of the phase noise becomes ½, that is, the magnitude of the phase noise is changed by the frequency division.

Due to the characteristics that the magnitude of the phase noise is changed by the frequency division, the phase noise components detected by the phase difference detectors 15 and 16 have become 1/N and 1/X respectively which correspond to the division ratios of the dividers 12 and 13.

Therefore, the constant multipliers 17 and 18 multiply the phase noise components that have been reduced by the frequency division by N and X which are the inverse numbers of the division ratios so as to restore the original values.

With the above operation, the phase noise components generated in the local oscillators 2 and 4 can be reproduced. The adder 19 adds both the reproduced phase noise components generated in the local oscillators 2 and 4 so as to compensate them in a single operation.

Finally, the transmitter uses the phase noise corrector 20 to give the opposite direction phase rotation to the phase noise obtained by adding the phase noise components generated in the local oscillators 2 and 4 so as to cancel it.

The phase noise corrector 20 is constituted by a complex multiplier as described above and converts the angle information of the phase noise obtained by the adder 19 into SIN/COS and calculates the complex conjugate thereof to thereby realize the opposite direction rotation operation.

As described in the column "Configuration of exemplary embodiment", the receiver has the SIN/COS table 34 and complex multiplier 29 in the carrier reproduction PLL 11. Thus, when a configuration in which the adder 33 for adding the angle information of the phase noises is provided immediately preceding to this part is adopted, the function of the phase noise corrector can be realized by using the SIN/COS table 34 and complex multiplier 29.

As a result, unlike the case of the transmitter, the phase noise correction device need not additionally be provided in the receiver.

(Effect of Exemplary Embodiment)

In a phase noise component detection method according to the related art, the phase noise detection may be affected by external factors such as phasing or thermal noise in addition to a local signal used for modulation/demodulation or frequency conversion, which is a generation source of the phase noise. Because the method according to the related art detects the phase noise based on the displacement or the like of the reception point of the modulated/demodulated signal.

On the other hand, in the present exemplary embodiment, it is possible to detect a phase noise component directly from a signal output from a local oscillator used for modulation/demodulation or frequency conversion, thereby allowing correction to be made using data with high reliability.

Further, in the phase noise component detection method according to the related art, if the reception data is data transmitted by a multilevel modulation scheme such as 64 QAM or 256 QAM, the amplitude or phase of the data differs depending on the signal reception point, so that there is a possibility that accurate phase noise cannot be detected due to the influence of amplifier nonlinear distortion or quantization error. On the other hand, according to the present exemplary embodiment, a phase noise component is extracted directly from the local signal as described above, so that the phase noise detection is less affected by the amplitude or noise than the case where the phase noise component is extracted from a modulated wave, thereby allowing correction to be made using data with high reliability.

Further, the phase noise component generated in the transmitter can be corrected within the transmitter, and the phase noise component generated in the receiver can be corrected within the receiver. That is, the phase noise correction processing which has been executed only on the receiver side can be shared between the transmitter and receiver, thereby reducing a load on the receiver.

As a result, in the present exemplary embodiment, it is possible to allow a demodulator (orthogonal demodulator 9 in the present exemplary embodiment) to be dedicated to demodulation of the RF signal into baseband signal which is the essential role of the demodulator, so that an increase in the characteristics of the demodulator can be expected.

Another Exemplary Embodiment

In the present invention, exemplary embodiments other than the above embodiment can be adopted.

Figure 1:
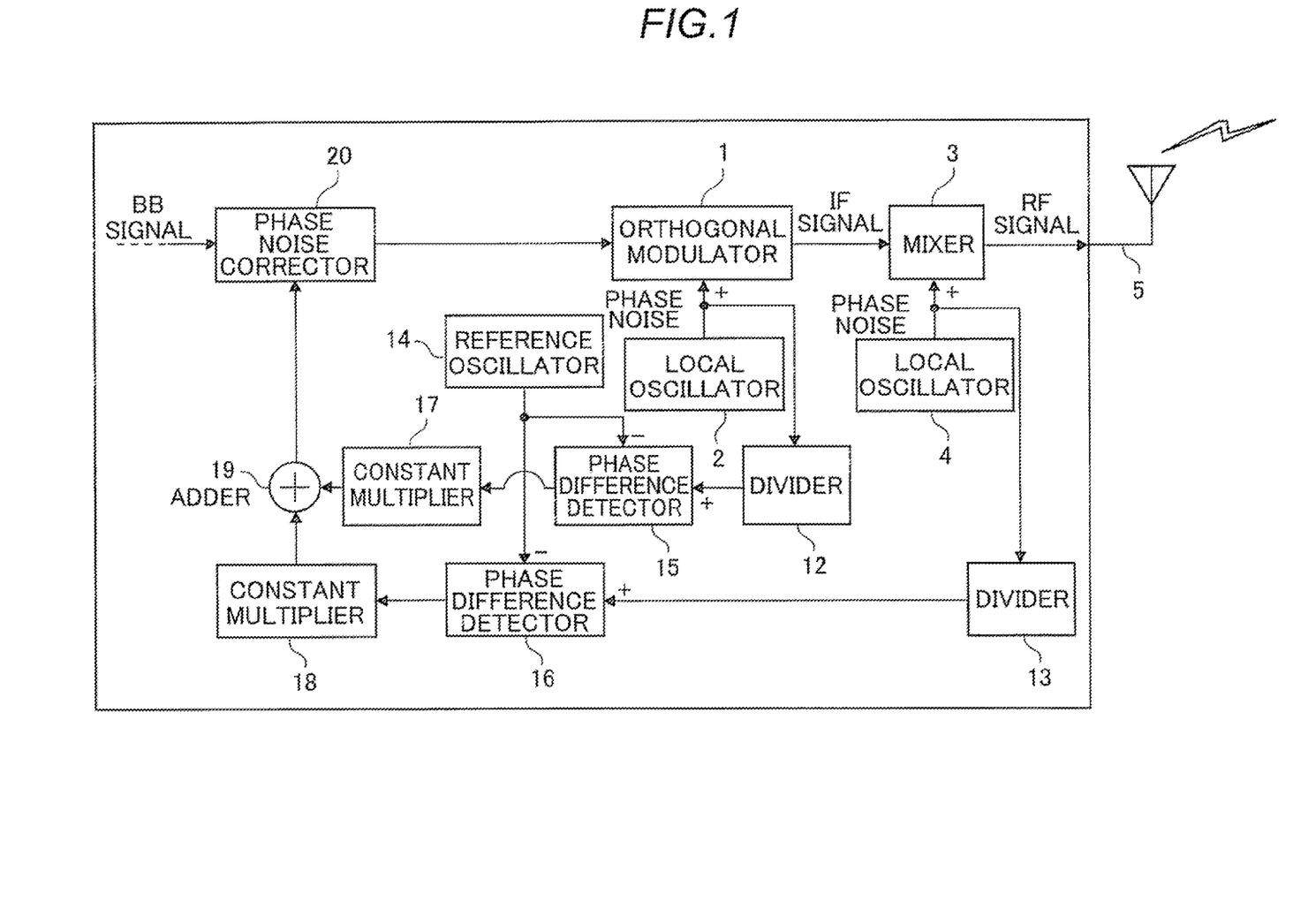
FIG. 1 is a view showing a basic configuration of a transmitter according to the present invention.
Figure 2:
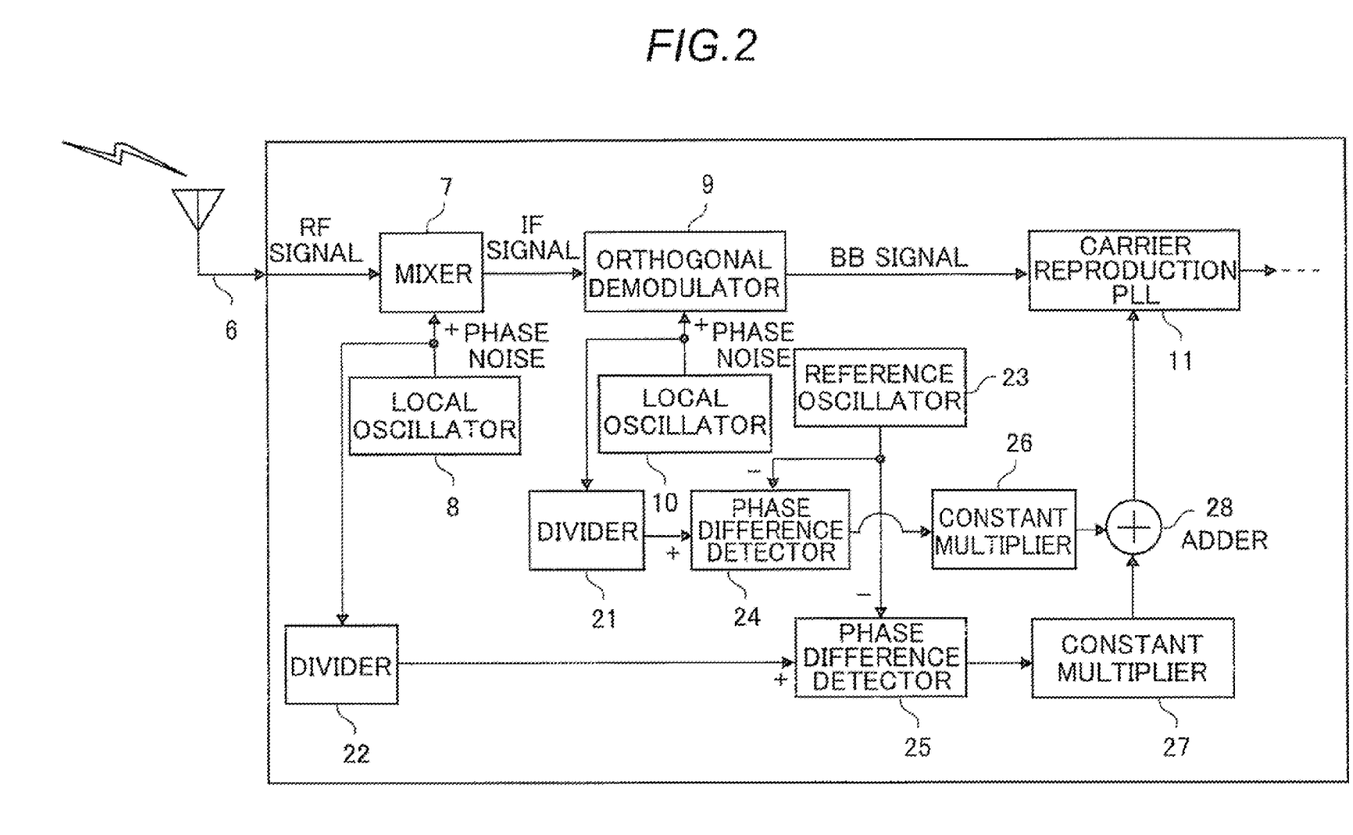
FIG. 2 is a view showing a basic configuration of a receiver according to the present invention.

In the configuration examples shown in FIGS. 1 and 2, it is assumed to correct the phase noises generated in both the local oscillators 4 and 8 for RF frequency generation and both the local oscillators 2 and 10 for IF frequency generation.

However, as another exemplary embodiment, there can be considered a configuration that corrects only the phase noise generated in the local oscillators 4 and 8 for RF frequency generation which generate especially large phase noise components.

As the configuration that corrects only the phase noise generated in the local oscillators 4 and 8, the following two exemplary embodiments will be described.

Figure 5:
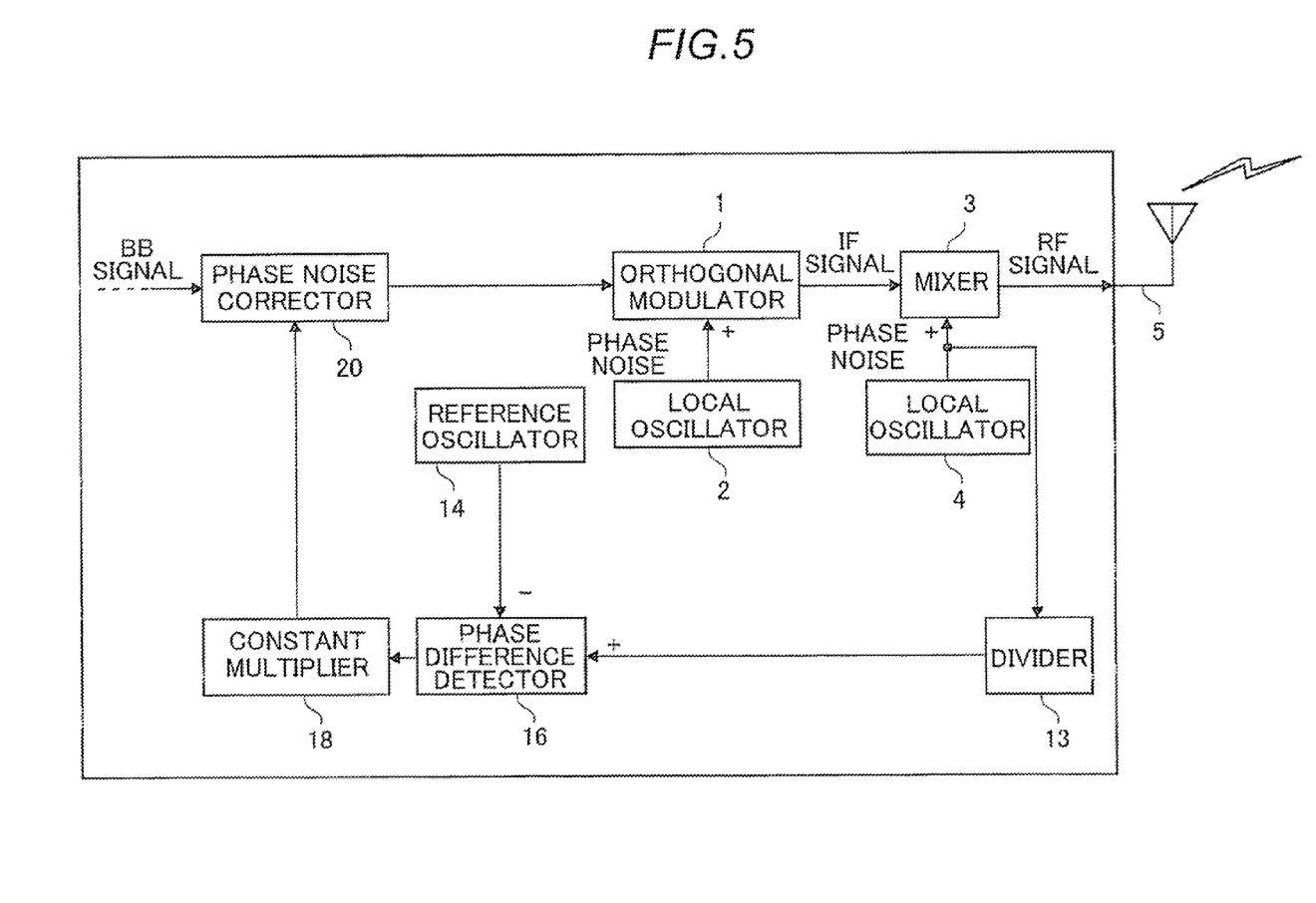
FIG. 5 is a configuration of the transmitter according to another exemplary embodiment of the present invention.
Figure 6:
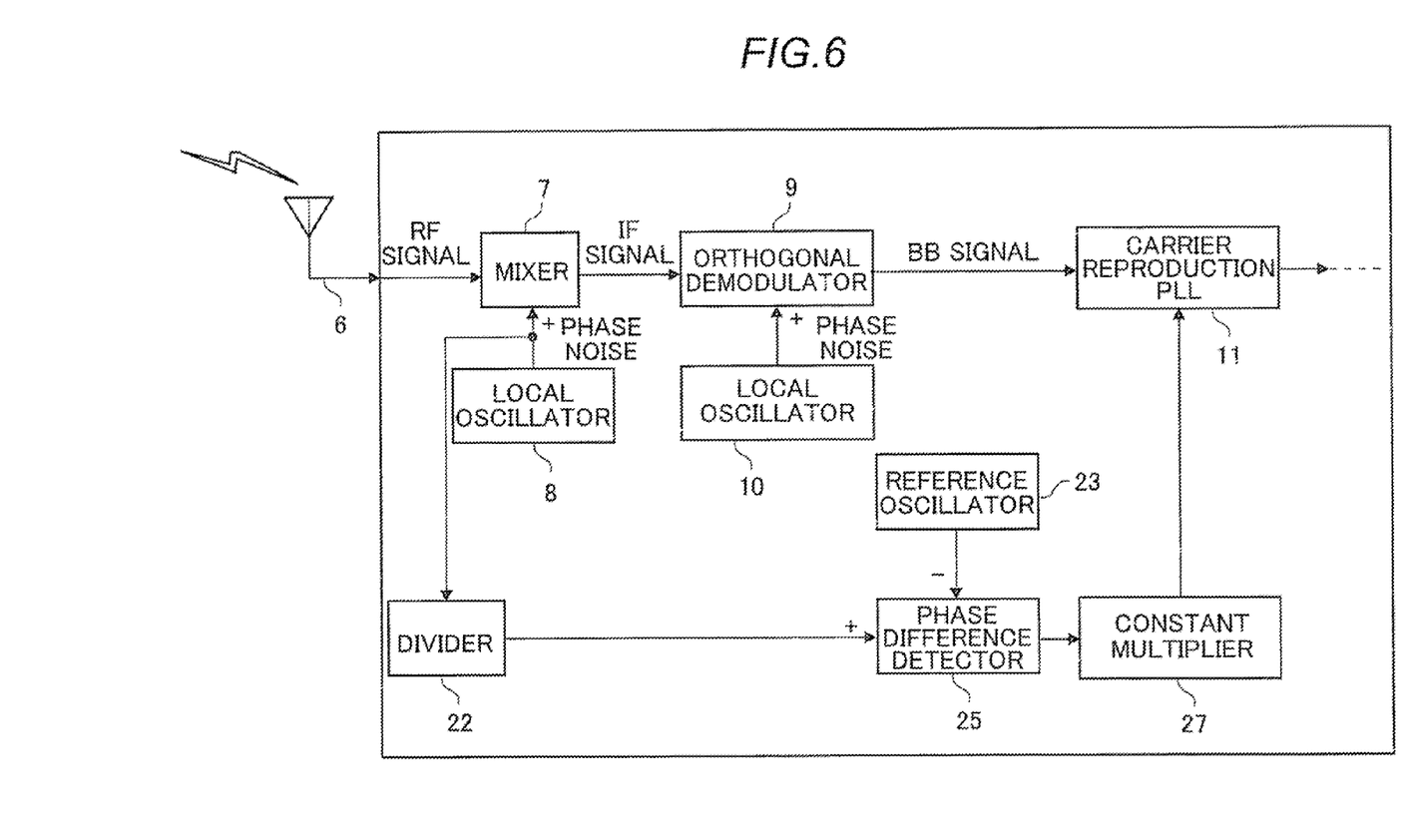
FIG. 6 is a configuration of the receiver according to another exemplary embodiment of the present invention.

The first one is an exemplary embodiment shown in FIGS. 5 and 6. In the present exemplary embodiment, the circuits for correcting the phase noises generated in the local oscillators 2 and 10, which are shown in the exemplary embodiment shown in FIGS. 1 and 2, have been removed. That is, as to the phase noise correction circuit, only the circuit for correcting the phase noises generated in the local oscillators 4 and 8 are provided.

The present exemplary embodiment aims only to correct the phase noises generated in the local oscillators 4 and 8 for RF frequency generation. The correction method itself is the same as that of the above exemplary embodiment shown in FIGS. 1 and 2.

By adopting the present exemplary embodiment, the circuit configuration can be simplified, thus enabling a reduction in the size of the device and in the cost thereof. Further, by correcting the phase noises generated in the local oscillators 4 and 8 for RF frequency generation which generate especially large phase noise components, the aim of correcting the phase noise can be achieved.

Figure 7:
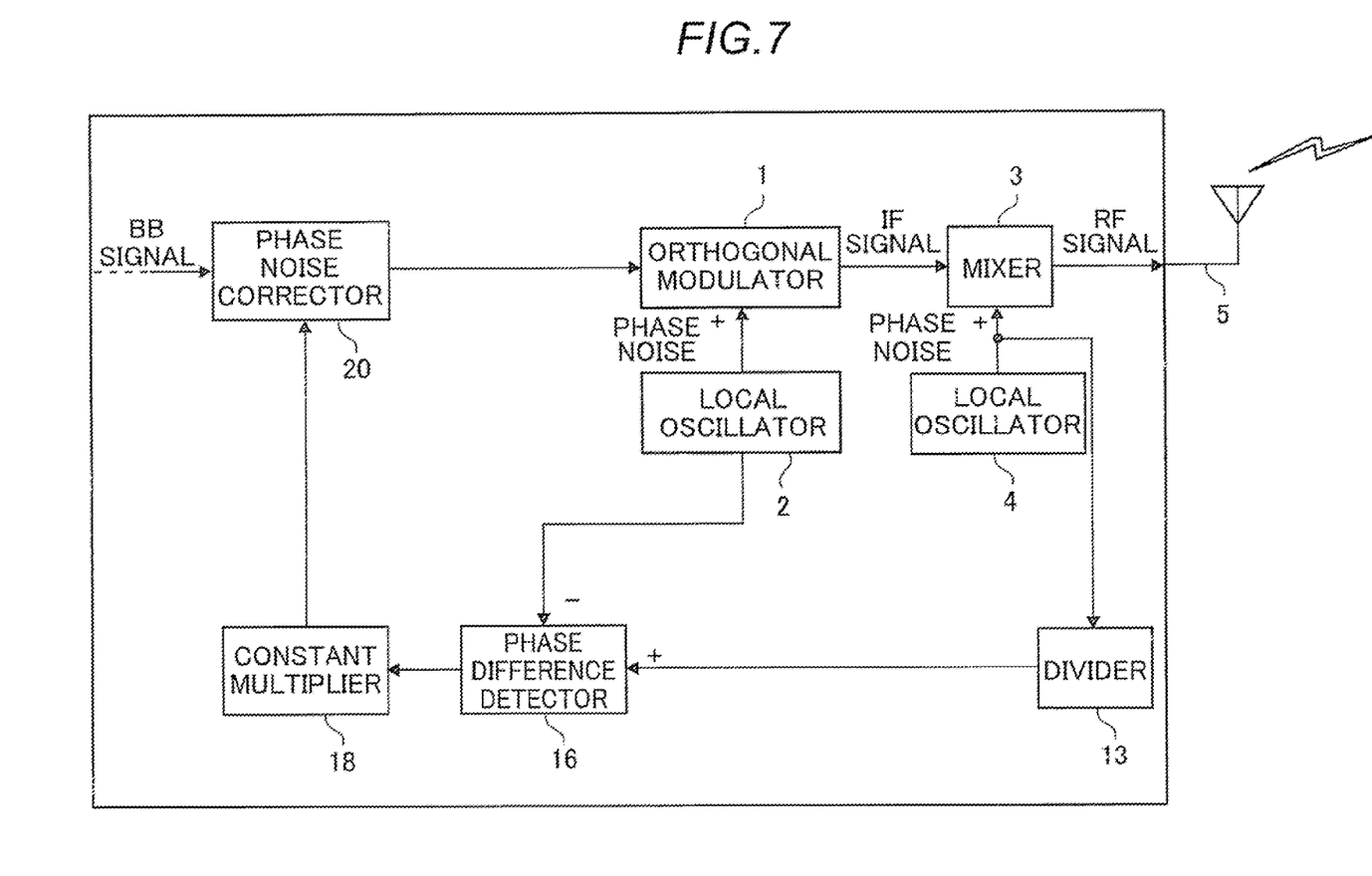
FIG. 7 is a configuration of the transmitter according to still another exemplary embodiment of the present invention.
Figure 8:
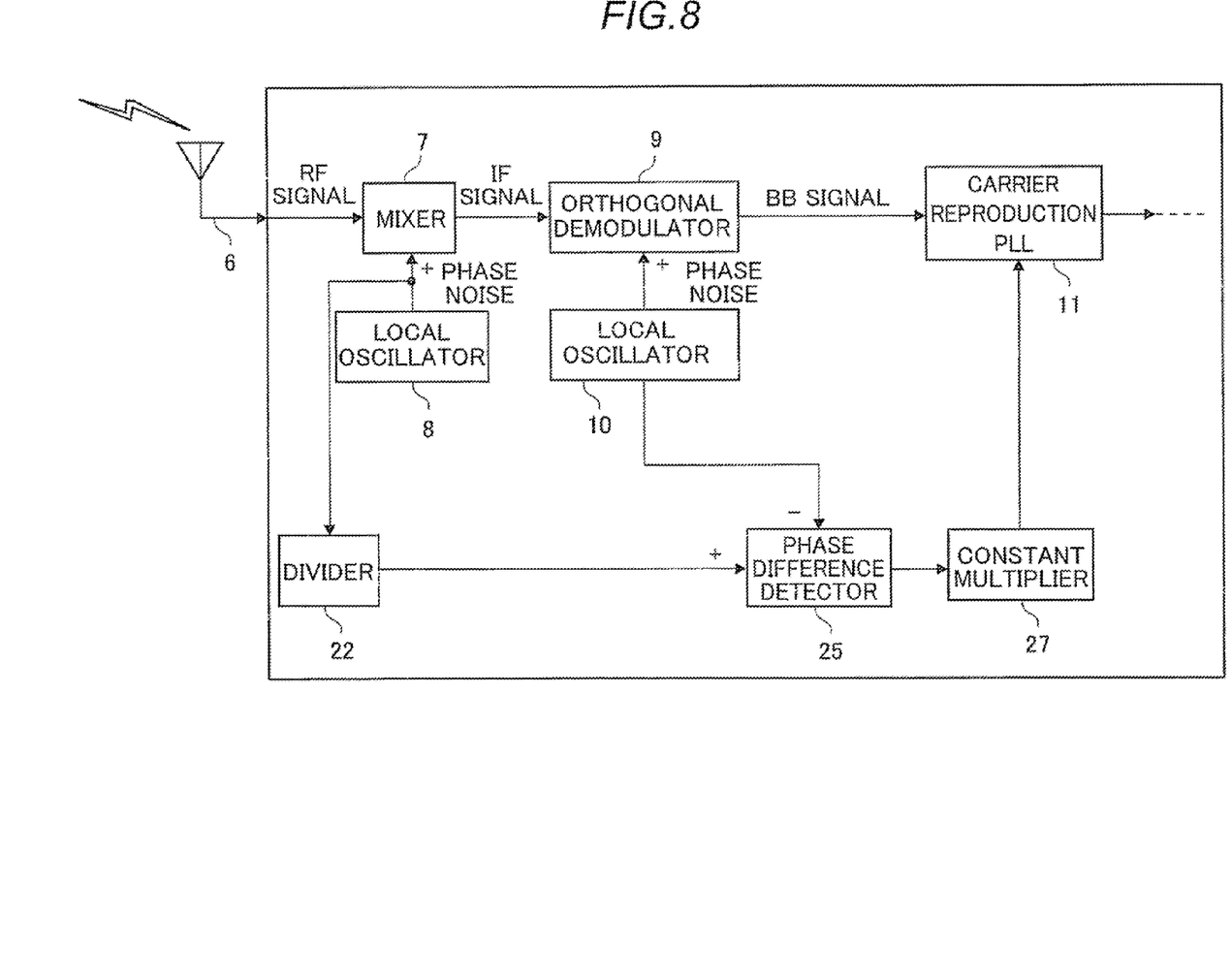
FIG. 8 is a configuration of the receiver according to still another exemplary embodiment of the present invention.

The second one is an exemplary embodiment shown in FIGS. 7 and 8, which is a modification of the above exemplary embodiment shown in FIGS. 5 and 6 obtained by further simplifying the circuit configurations.

This modification is particularly suited to a case where the phase noises generated in the local oscillators 2 and 10 are small enough to be ignored with respect to the local oscillators 4 and 8.

In this modification, the functions of the reference oscillators 14 and 23 shown in FIGS. 1 and 2 are realized by using the local oscillators 2 and 10.

That is, signals generated by the local oscillators 2 and 10 are used as substitutes for the reference signals generated by the reference oscillators 14 and 23. In this modification, the division ratio is set so that the frequencies of signals output from the dividers 13 and 22 become the same as the frequencies of signals output from the local oscillators 2 and 10.

The frequency of a signal after frequency division needs to be the same as the frequency of a signal generated by the reference oscillator in the exemplary embodiments described above. However, the above requirement can be removed in configuration examples shown in FIGS. 9 and 10.

Figure 9:
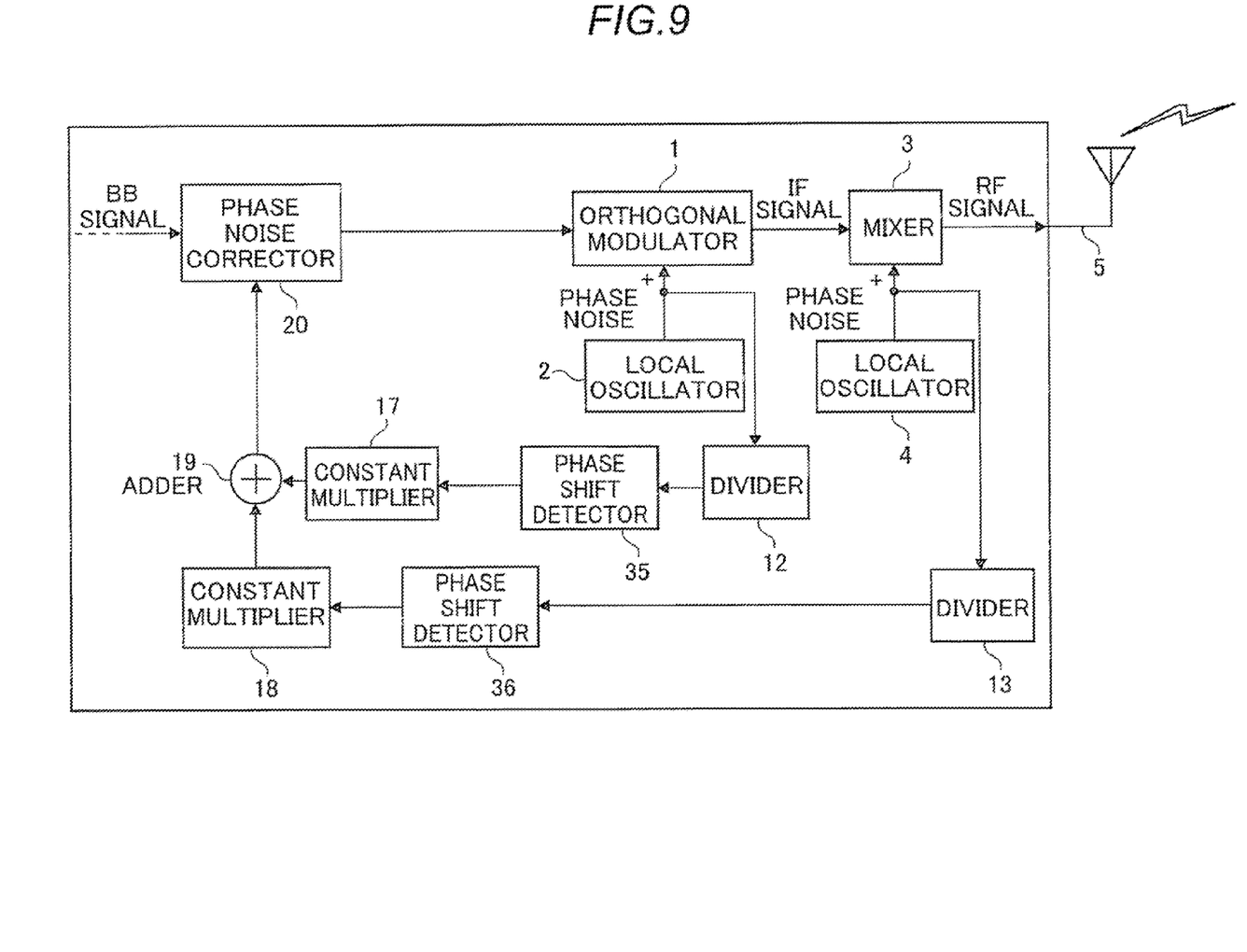
FIG. 9 is a configuration of the transmitter according to still another exemplary embodiment of the present invention.
Figure 10:
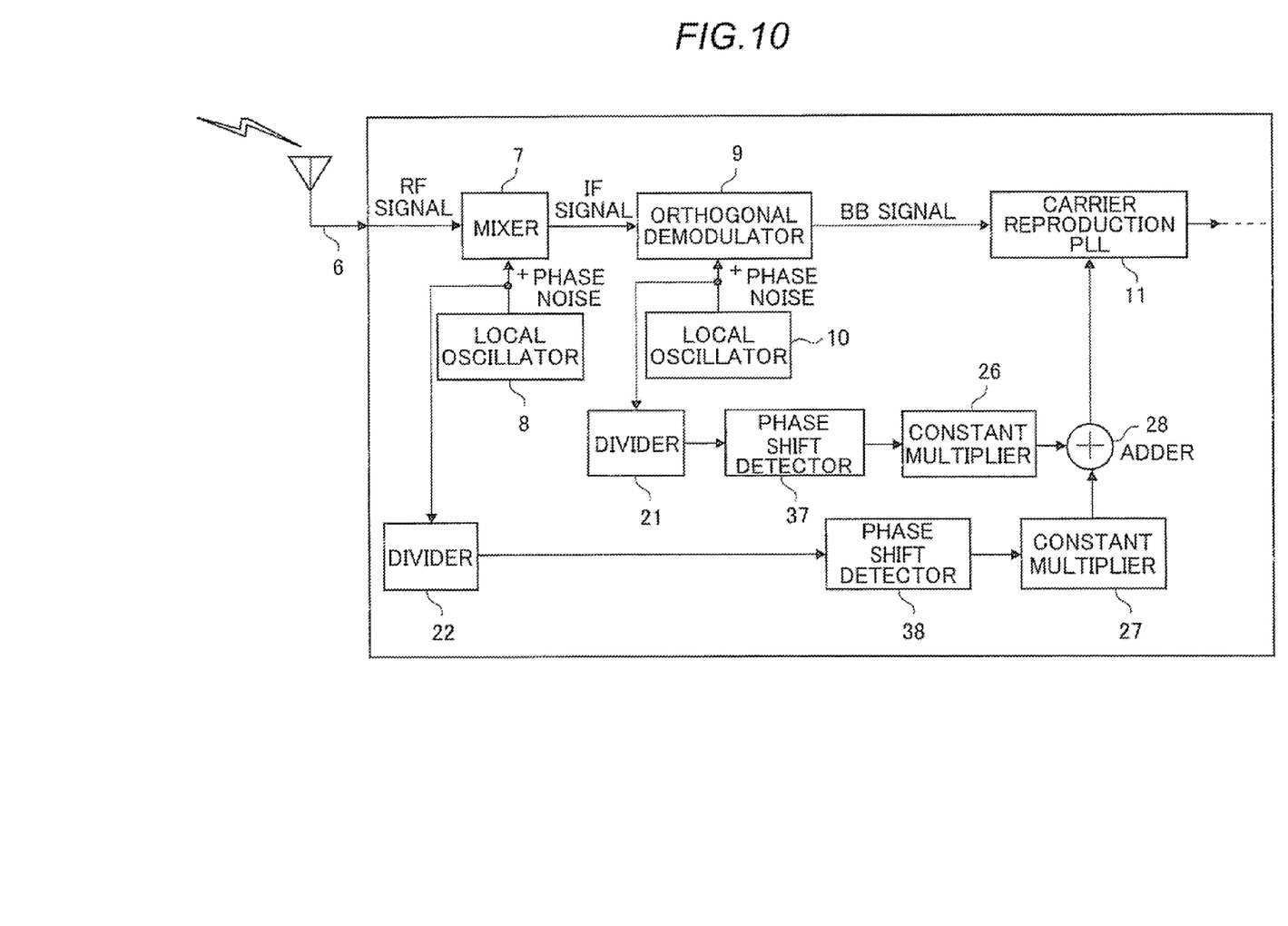
FIG. 10 is a configuration of the receiver according to still another exemplary embodiment of the present invention.

In the exemplary embodiment shown in FIGS. 9 and 10, phase shift detectors 35, 36, 37, and 38 are provided as substitutes for the reference oscillators 14 and 23 and phase difference detectors 15, 16, 24, and 25.

Figure 11:
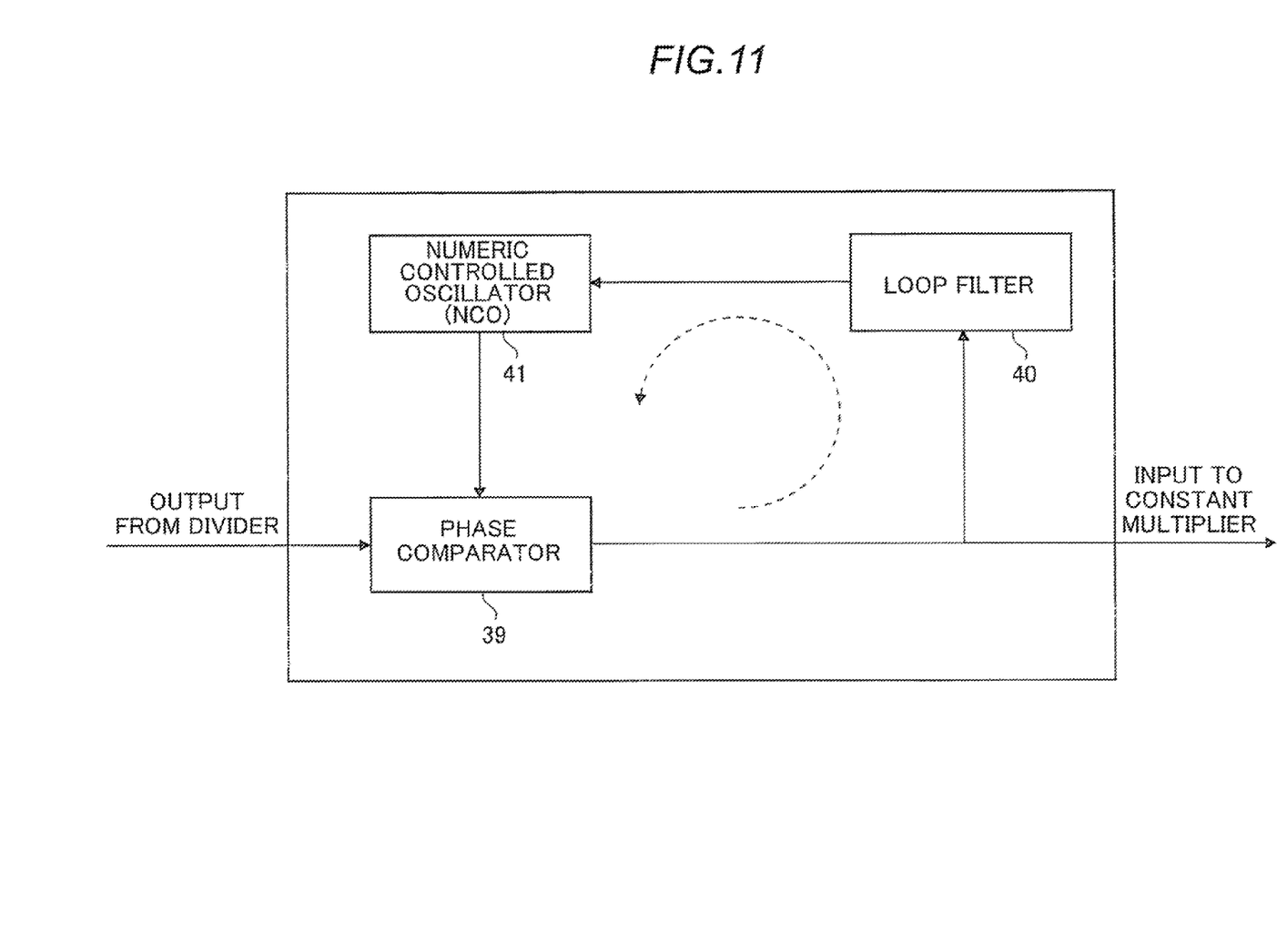
FIG. 11 is a view showing a configuration of a phase shift detector.

The four phase shift detectors have the same configuration, which is shown in FIG. 11.

The phase shift detector detects a phase difference between a divider output that has been input to a phase comparator 39 and output signal of a numeric controlled oscillator (NCO) 41.

The detected phase difference is input to the loop filter 40, where the high-frequency component thereof is removed, and then input to the numeric controlled oscillator 41. By forming the above PLL (Phase locked Loop), it is possible to automatically generate a signal of the same frequency as that of the output signal of the divider.

When the bandwidth of the PLL is sufficiently narrowed, the output of the phase comparator 39 exhibits a phase shift corresponding to phase noise, so that the phase noise component can be detected.

With the above configuration, it is possible to remove the requirement that the frequency of a signal after frequency division needs to be the same as the frequency of a signal generated by the reference oscillator.

Although the exemplary embodiments of the present invention have been described in detail, it should be understood that various changes, substitutions and alternatives can be made therein without departing from the spirit and scope of the invention as defined by the appended claims. Further, it is the inventor's intent to retain all equivalents of the claimed invention even if the claims are amended during prosecution.

INDUSTRIAL APPLICABILITY

The present invention can be applied to the field of high-frequency digital wireless communication.

What is claimed is:

1. A phase noise correction device for correcting a phase noise generated in a local oscillator, comprising:
   a division section that divides a signal generated in the local oscillator;
   a reference signal generation section that generates a signal of the same frequency as that of the divided signal;
   a phase difference detection section that detects a phase difference between the divided signal and the generated reference signal; and
   a phase noise correction section that gives a phase rotation to a baseband signal in the direction that cancels the phase noise according to the detected phase difference as a phase noise component.

2. The phase noise correction device according to claim 1, wherein the reference signal generation section is a reference oscillator.

3. The phase noise correction device according to claim 1, wherein the reference signal generation section is a local oscillator different from a generation source of the signal to be divided.

4. The phase noise correction device according to claim 1, wherein a carrier reproduction PLL circuit is used as the phase noise correction section.

5. The phase noise correction device according to claim 1, further comprising
   a constant multiplication section that multiplies the detected phase difference by a predetermined constant.

6. The phase noise correction device according to claim 1, further comprising
   a plurality of the division sections and phase difference detection sections and further comprising an addition section that adds outputs from the phase difference detection sections and outputs the addition result to the phase noise correction section.

7. A phase noise correction method for correcting a phase noise generated in a local oscillator, comprising:
   a step in which a division section divides a signal generated in the local oscillator;
   a step in which a reference signal generation section generates a signal of the same frequency as that of the divided signal;

a step in which a phase difference detection section detects a phase difference between the divided signal and the generated reference signal; and a step in which a phase noise correction section gives a phase rotation to a baseband signal in the direction that cancels the phase noise according to the detected phase difference as a phase noise component.

8. The phase noise correction method according to claim 7, wherein the reference signal generation section is a reference oscillator.

9. The phase noise correction method according to claim 7, wherein the reference signal generation section is a local oscillator different from a generation source of the signal to be divided.

10. The phase noise correction method according to claim 7, wherein a carrier reproduction PLL circuit is used as the phase noise correction section.

11. The phase noise correction method according to claim 7, further comprising a step in which a constant multiplication section multiplies the detected phase difference by a predetermined constant.

12. The phase noise correction method according to claim 7, further comprising a step in which an addition section that adds, in the case where there are a plurality of the division sections and phase difference detection sections, outputs from the phase difference detection sections and outputs the addition result to the phase noise correction section.

* * * * *